US012811562B2

(12) United States Patent
Hennel et al.

(10) Patent No.: US 12,811,562 B2
(45) Date of Patent: Nov. 24, 2026

(54) SURFACE ACOUSTIC WAVE DEVICES WITH DECOUPLED INTERDIGITAL CAPACITORS

(71) Applicant: RF360 Singapore Pte. Ltd., Singapore (SG)

(72) Inventors: Markus Hennel, Munich (DE); Marc Esquius Morote, Munich (DE)

(73) Assignee: RF360 Singapore Pte. Ltd., Republic Plaza (SG)

(*) Notice: Subject to any disclaimer, the term of this patent is extended or adjusted under 35 U.S.C. 154(b) by 226 days.

(21) Appl. No.: 18/543,953

(22) Filed: Dec. 18, 2023

(65) Prior Publication Data

US 2025/0202453 A1 Jun. 19, 2025

(51) Int. Cl.

| | |
|---|---|
| ***H03H 9/145*** | (2006.01) |
| ***H03H 3/08*** | (2006.01) |
| ***H03H 9/25*** | (2006.01) |
| ***H03H 9/64*** | (2006.01) |

(52) U.S. Cl.

CPC .............. *H03H 9/145* (2013.01); *H03H 3/08* (2013.01); *H03H 9/25* (2013.01); *H03H 9/64* (2013.01)

(58) Field of Classification Search

CPC ............. H03H 9/145; H03H 9/25; H03H 9/64

See application file for complete search history.

(56) References Cited

U.S. PATENT DOCUMENTS

| | | | | |
|---|---|---|---|---|
| 5,694,095 | A | 12/1997 | Mineyoshi | |
| 7,688,161 | B2 * | 3/2010 | Miura | H03H 9/6483 333/195 |
| 10,256,791 | B2 * | 4/2019 | Tsutsumi | H03H 9/6483 |
| 10,587,242 | B2 * | 3/2020 | Jeung | H10N 30/076 |
| 10,778,181 | B2 * | 9/2020 | Goto | H10N 30/87 |
| 10,804,881 | B2 * | 10/2020 | Urata | H03H 9/6489 |
| 11,031,920 | B2 * | 6/2021 | Nosaka | H03H 9/6413 |
| 12,323,132 | B2 * | 6/2025 | Ouchi | H03H 9/568 |
| 2008/0129418 | A1 * | 6/2008 | Miura | H03H 9/6483 333/195 |
| 2017/0279432 | A1 * | 9/2017 | Murase | H03H 9/6483 |

OTHER PUBLICATIONS

McPherson, "Trends in the Ultimate Breakdown Strength of High Dielectric-Constant Materials", IEEE Transactions on Electron Devices, vol. 50, No. 8, Aug. 2003 (Year: 2003).*

International Search Report and Written Opinion—PCT/SG2024/050753—ISA/EPO—Mar. 13, 2025.

* cited by examiner

*Primary Examiner* — Andrea Lindgren Baltzell
*Assistant Examiner* — Alan Wong
(74) *Attorney, Agent, or Firm* — Patterson Sheridan LLP

(57) ABSTRACT

Certain aspects of the present disclosure provide an electroacoustic device and methods of fabricating such an electroacoustic device. One example electroacoustic device generally includes a piezoelectric layer, a surface-acoustic-wave (SAW) resonator disposed above the piezoelectric layer, a non-piezoelectric region disposed adjacent to the piezoelectric layer, and an interdigital transducer capacitor (IDC) electrically coupled to the SAW resonator and disposed above the non-piezoelectric region.

20 Claims, 9 Drawing Sheets

SURFACE ACOUSTIC WAVE DEVICES WITH DECOUPLED INTERDIGITAL CAPACITORS

BACKGROUND

Technical Field

Certain aspects of the present disclosure relate generally to electronic components and, more particularly, to surface acoustic wave (SAW) devices.

Background

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices, such as smartphones).

Today, surface acoustic wave (SAW) or bulk acoustic wave (BAW) components may be used in wireless communication devices, such as for implementing RF filters. In SAW technology, the acoustic wave propagates laterally on a surface of a piezoelectric substrate, with the movement of the piezoelectric material generated by metal interdigital transducers (IDTs) on the surface. The wavelength of the acoustic wave may be defined by the pitch (e.g., the width of the metal finger and gap) of the IDT. In BAW technology, the acoustic wave propagates vertically through a three-dimensional structure, with an electric field applied through electrodes above and below a piezoelectric material. The wavelength, in this case, is defined by the thickness of the piezoelectric material.

In one type of SAW device a surface acoustic wave is generated by an input IDT and detected by an output IDT. In another type of SAW device, the acoustic energy may be confined using reflectors on either side of the IDT. A planar resonant cavity created between two mirrors consisting of reflecting metal strips can also be used to trap the acoustic energy.

As the number of frequency bands used in wireless communications increases and as the desired frequency band of filters widen, the performance of acoustic filters increases in importance to reduce losses and increase overall performance of electronic devices. Acoustic filters with improved performance, particularly filters with reduced intermodulation distortion, are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include increased radio frequency (RF) filter performance.

Certain aspects of the present disclosure provide an electroacoustic device. The electroacoustic device generally includes a piezoelectric layer, a surface-acoustic-wave (SAW) resonator disposed above the piezoelectric layer, a first non-piezoelectric region disposed adjacent to the piezoelectric layer, and an interdigital capacitor (IDC) electrically coupled to the SAW resonator and disposed above the first non-piezoelectric region.

Certain aspects of the present disclosure provide a filter circuit. The filter circuit generally includes a plurality of resonators and a capacitor electrically coupled to a resonator in the plurality of resonators, wherein the capacitor and the resonator comprise the IDC and the SAW resonator, respectively, of the electroacoustic device described herein.

Certain aspects of the present disclosure provide a wireless device. The wireless device generally includes the electroacoustic device described herein and at least one of an antenna or a radio frequency (RF) circuit coupled to the electroacoustic device.

Certain aspects of the present disclosure provide a method of fabricating an electroacoustic device. The method generally includes forming a first non-piezoelectric region adjacent to a piezoelectric layer, forming a SAW resonator above the piezoelectric layer, and forming an IDC above the first non-piezoelectric region.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized in other aspects without specific recitation.

DETAILED DESCRIPTION

Figure 1A:
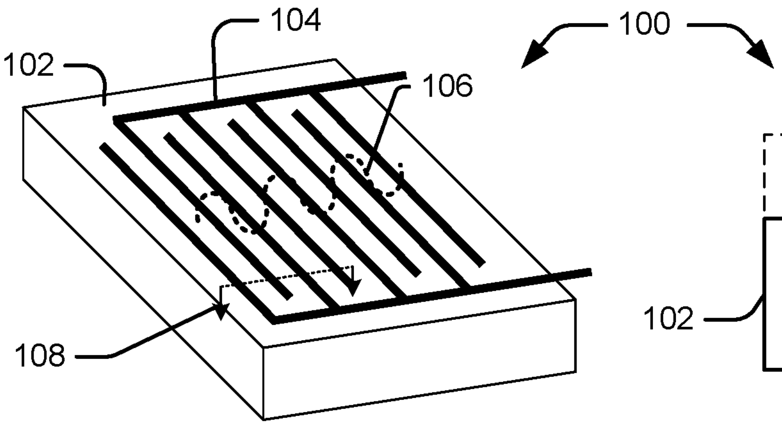
FIG. 1A is a diagram of a perspective view of an example electroacoustic device, in which certain aspects of the present disclosure may be practiced.

Certain aspects of the present disclosure generally relate to an electroacoustic device with one or more interdigital capacitors (IDCs) decoupled from a piezoelectric layer of the electroacoustic device. Such an electroacoustic device may include the piezoelectric layer, a surface-acoustic-wave (SAW) resonator disposed above the piezoelectric layer, a non-piezoelectric region disposed adjacent to the piezoelectric layer, and the one or more IDCs, which are electrically coupled to the SAW resonator and disposed above the non-piezoelectric region. In this manner, no portion of the piezoelectric layer is disposed between the IDC(s) and the non-piezoelectric region, such that the one or more IDCs are decoupled from the piezoelectric layer. In certain aspects, the non-piezoelectric region may be disposed in a cavity of the piezoelectric layer.

The detailed description set forth below in connection with the appended drawings is intended as a description of exemplary implementations and is not intended to represent the only implementations in which aspects of the present disclosure may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Example Electroacoustic Devices

FIG. 1A is a diagram of a perspective view of an example electroacoustic device 100. The electroacoustic device 100 may be configured as or may be a portion of a SAW resonator. In certain descriptions herein, the electroacoustic device 100 may be referred to as a SAW resonator. However, there may be other electroacoustic device types that may be constructed based on the principles described herein.

The electroacoustic device 100 includes an electrode structure 104, that may be referred to as an interdigital transducer (IDT), on the surface of a piezoelectric material 102. The electrode structure 104 generally includes first and second comb-shaped electrode structures (electrically conductive and generally metallic) with electrode fingers extending from two busbars towards each other arranged in an interlocking manner in between the two busbars (e.g., arranged in an interdigitated manner, as shown). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

Figure 1B:
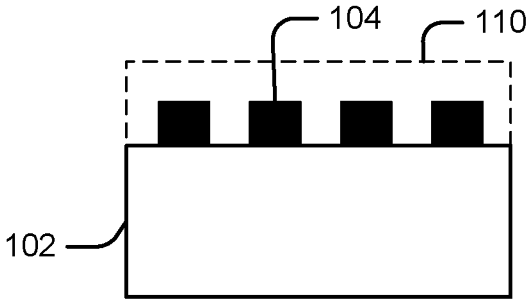
FIG. 1B is a diagram of a cross-sectional view of the example electroacoustic device of FIG. 1A.

FIG. 1B is a diagram of a cross-sectional view of the electroacoustic device 100 of FIG. 1A along a cross-section 108 shown in FIG. 1A. The electroacoustic device 100 is illustrated by a simplified layer stack including the piezoelectric material 102 with the electrode structure 104 disposed on the piezoelectric material 102. The electrode structure 104 is electrically conductive and generally formed from metallic materials. The electrode structure 104 may alternatively be formed from materials that are electrically conductive, but non-metallic (e.g., graphene). The piezoelectric material 102 may be formed from a variety of materials such as quartz, lithium tantalate ($LiTaO_3$), lithium niobite ($LiNbO_3$), doped variants of these, other piezoelectric materials, or other crystals. The piezoelectric material 102 may be referred to as a "piezoelectric substrate," but may also be referred to as a "piezoelectric layer," such as in examples where there are additional layers below the piezoelectric material 102.

It should be appreciated that more complicated layer stacks including layers of various materials may be possible within the stack. For example, optionally, a temperature compensation layer 110 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
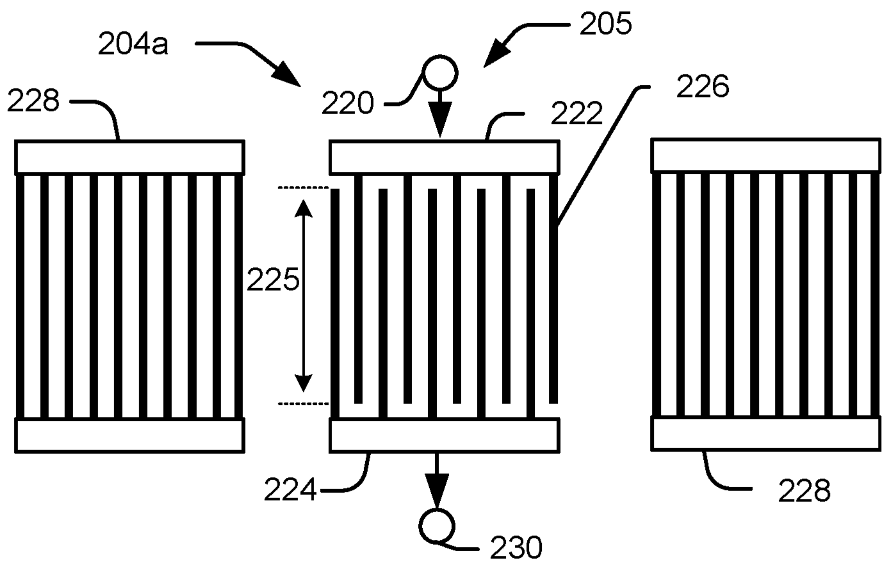
FIG. 2A is a top view of an example electrode structure of an electroacoustic device, in which certain aspects of the present disclosure may be practiced.

FIG. 2A is a top view of an example electrode structure 204*a* of an electroacoustic device. The electrode structure 204*a* has an IDT 205 that includes a first busbar 222 (e.g., first conductive segment or rail) electrically coupled to a first terminal 220 and a second busbar 224 (e.g., second conductive segment or rail) spaced from the first busbar 222 and coupled to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222. Similarly, small gaps may also be formed between fingers 226 and any structure extending from the first busbar 222 or the second busbar 224 (e.g., stub fingers).

Between the busbars, there is an overlap region including a central region where a portion of one finger overlaps with a portion of an adjacent finger as illustrated by the central region 225. This central region 225 including the overlap may be referred to as the aperture, track, or active region where electric fields are produced between the fingers 226 to cause an acoustic wave to propagate in this region of the piezoelectric material 102. The periodicity of the fingers 226 is referred to as the pitch of the IDT. The pitch may be indicated in various ways. For example, in certain aspects, the pitch may correspond to a magnitude of a distance between fingers in the central region 225. This distance may be defined, for example, as the distance between center points of each of the fingers (and may be generally measured between a right (or left) edge of one finger and the right (or left) edge of an adjacent finger when the fingers have uniform width). In certain aspects, an average of distances between adjacent fingers may be used as the pitch. The frequency at which the piezoelectric material vibrates is a main resonance frequency of the electrode structure 204*a*. This frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output, such as to one of the first terminal 220 or the second terminal 230, while the other terminal may function as an input.

A variety of electrode structures are possible. FIG. 2A may generally illustrate a one-port configuration. Other configurations (e.g., two-port configurations) are also possible. For example, the electrode structure 204*a* may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
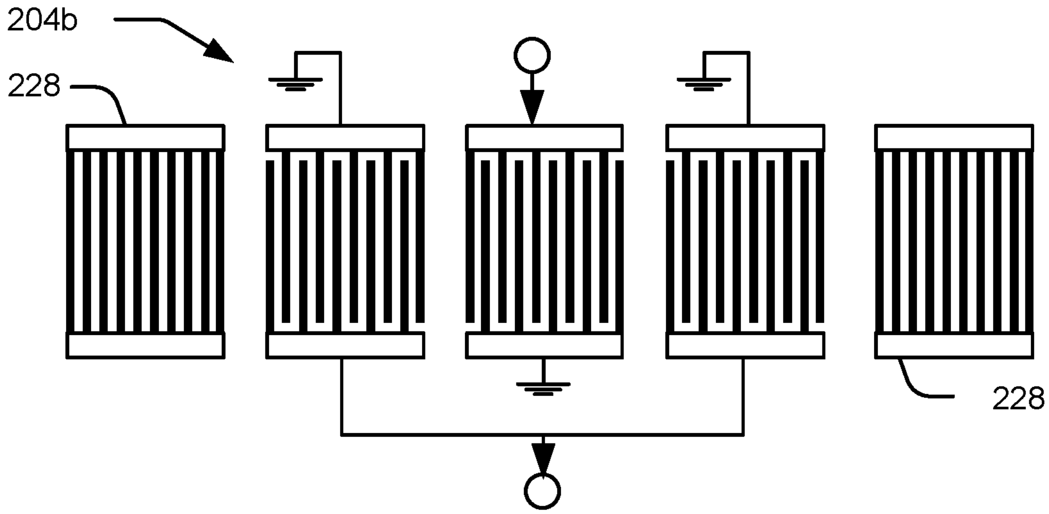
FIG. 2B is a top view of another example electrode structure of an electroacoustic device, in which certain aspects of the present disclosure may be practiced.

FIG. 2B is a top view of another example electrode structure 204*b* of an electroacoustic device. In this case, a dual-mode SAW (DMS) electrode structure 204*b* is illustrated, the DMS structure being a structure that may induce multiple resonances. The electrode structure 204*b* includes multiple IDTs arranged between reflectors 228 and connected as illustrated. The electrode structure 204*b* is provided to illustrate the variety of electrode structures in which principles described herein may be applied.

It should be appreciated that while a certain number of fingers 226 are illustrated, the number of actual fingers and length(s) and width(s) of the fingers 226 and busbars may be different in an actual implementation. Such parameters depend on the particular application and desired filter characteristics. In addition, a SAW filter may include multiple interconnected electrode structures each including multiple IDTs to achieve a desired passband (e.g., multiple interconnected resonators or IDTs to form a desired filter transfer function).

Figure 3A:
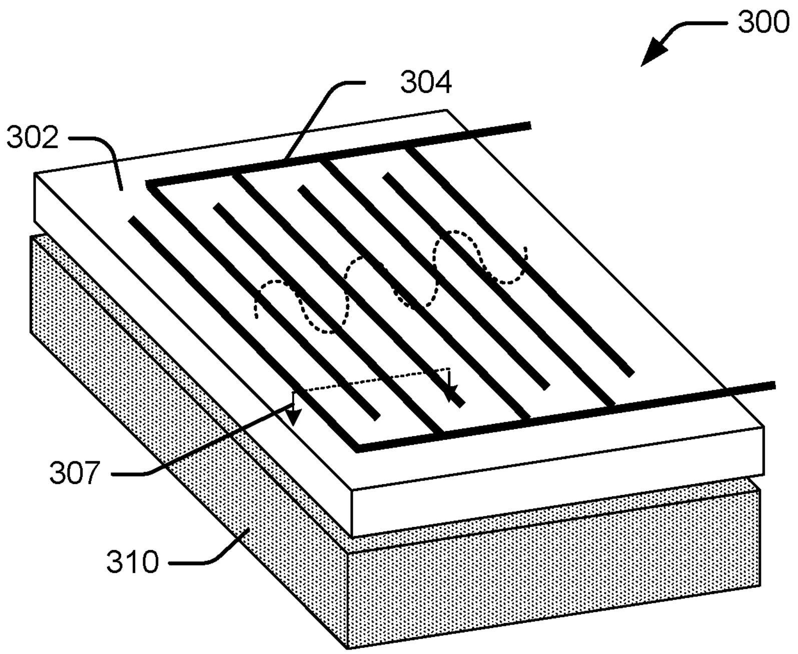
FIG. 3A is a diagram of a perspective view of an example electroacoustic device, in which certain aspects of the present disclosure may be practiced.

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1A) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher quality factor (Q) as compared to the electroacoustic device 100 of FIG. 1A. In general, the substrate 310 may be substantially thicker than the piezoelectric material 302 (e.g., on the order of 50 to 100 times thicker, or more). The substrate 310 may include other layers (or other layers may be included between the substrate 310 and the piezoelectric material 302).

Figure 3B:
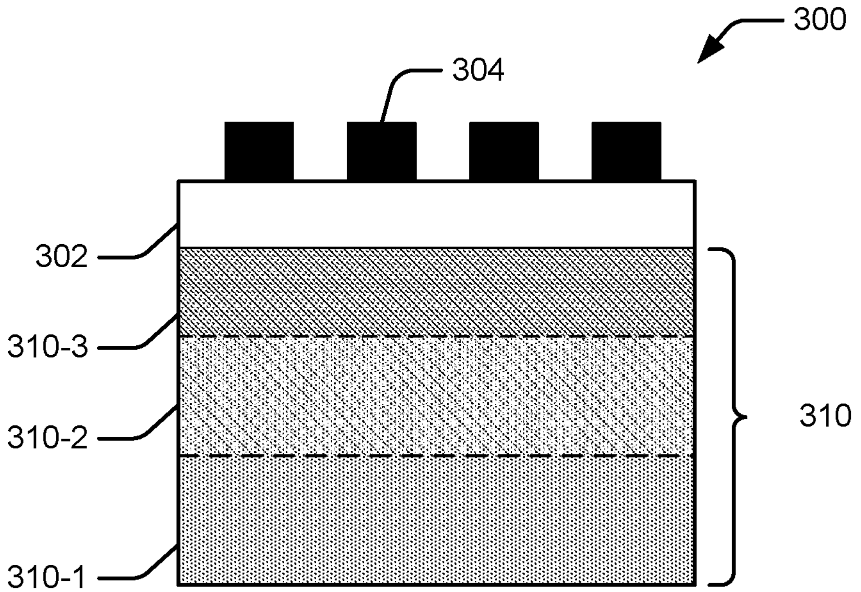
FIG. 3B is a diagram of a cross-sectional view of the example electroacoustic device of FIG. 3A.

FIG. 3B is a diagram of a cross-sectional view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—a high resistivity layer). The substrate 310 may further include a trap rich layer 310-2 (e.g., polysilicon). The substrate 310 may further include a compensation layer 310-3 (e.g., silicon dioxide ($SiO_2$) or another dielectric material) that may provide temperature compensation and other properties. These sublayers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices, such as between the electroacoustic device 100 of FIG. 1A and the electroacoustic device 300 of FIGS. 3A and 3B.

Example Electroacoustic Device with Interdigital Capacitors (IDCs)

Figure 4A:
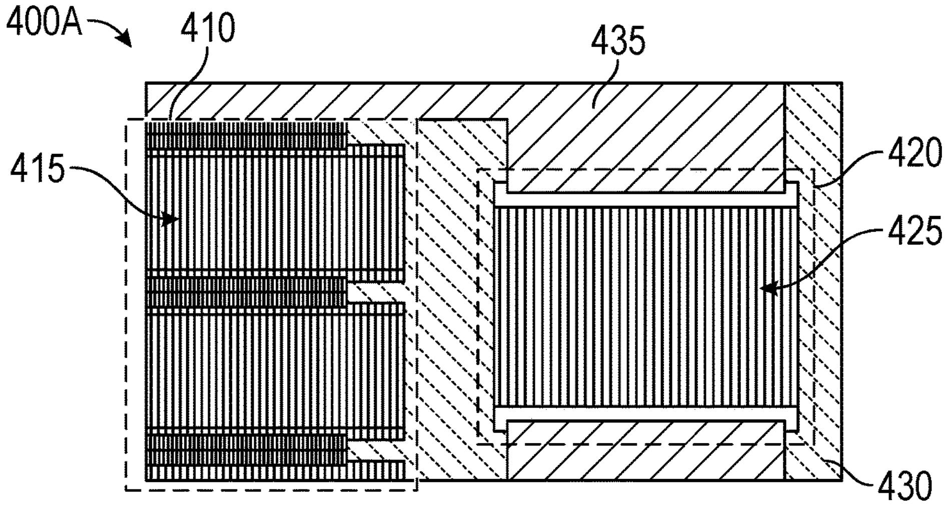
FIG. 4A is a diagram of a top view of an example electroacoustic device including a surface acoustic wave (SAW) resonator and an interdigital capacitor (IDC), in accordance with certain aspects of the present disclosure.

Some electroacoustic devices (e.g., SAW devices) may include IDCs to improve the skirt (e.g., the transition band) steepness of filters implemented by the electroacoustic devices. The IDCs may be integrated on an electroacoustic device, and may utilize a structure similar to SAW resonators implemented as IDTs, but may resonate at a higher frequency to minimize (or at least reduce) in-band losses in the electroacoustic devices. FIG. 4A is a diagram of a top view of an example electroacoustic device 400A including a surface acoustic wave (SAW) resonator and an IDC, in accordance with certain aspects of the present disclosure. Although only a single IDC is illustrated in the Figures and referred to herein, any number of IDCs may be utilized in the electroacoustic devices described herein.

As illustrated in FIG. 4A, the electroacoustic device 400A may include a SAW resonator 410 (which may be implemented as an IDT) and an IDC 420 both disposed above a piezoelectric layer 430 (e.g., piezoelectric material 102, 302). The IDC 420 may be electrically coupled to the SAW resonator 410 through a conductive trace 435. The SAW resonator 410 may include an array of conductive fingers 415 (e.g., fingers 226) aligned in a first direction, and the IDC 420 may include an array of conductive fingers 425 (e.g., similar to fingers 226) also aligned in the first direction. In this manner, the array of conductive fingers 415 in the SAW resonator 410 and the array of conductive fingers 425 in the IDC 420 are aligned in the same direction.

In the electroacoustic device 400A of FIG. 4A, the IDC 420 is disposed above and coupled to the piezoelectric layer 430. As a result, spurious modes may be present in any filter implemented by the electroacoustic device 400A. In addition, because the IDC 420 resonates at a higher frequency than the SAW resonator 410, the pitch of the IDC 420 may be smaller. As a result of this smaller pitch, the capacitance of the IDC 420 may vary significantly between different electroacoustic devices in production, due to finger width variations that arise during manufacturing.

Certain aspects of the present disclosure are directed to an electroacoustic device that utilizes an IDC that is decoupled from a piezoelectric layer of the electroacoustic device. In this manner, the spurious modes in any filter implemented by the electroacoustic device may be removed, or at least reduced.

Figure 4B:
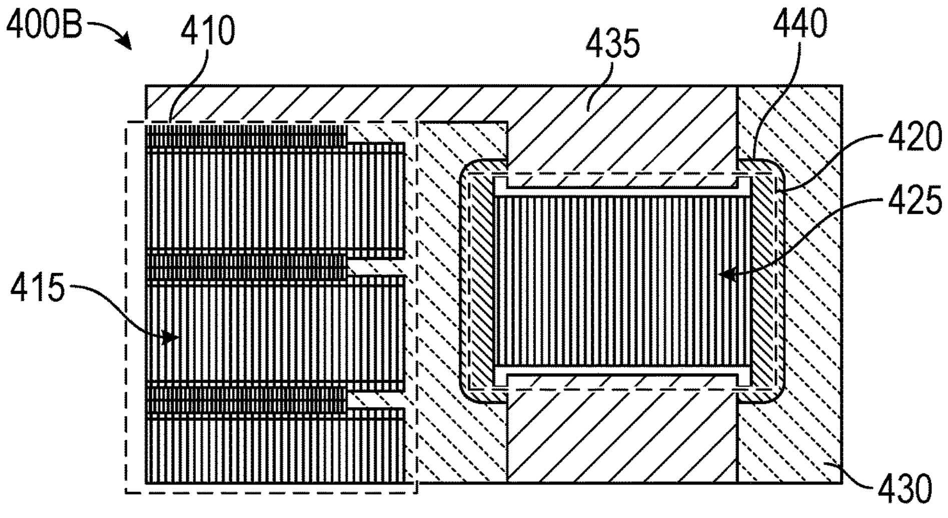
FIG. 4B is a diagram of a top view of an example electroacoustic device including a SAW resonator and an IDC decoupled from a piezoelectric layer of the electroacoustic device, in accordance with certain aspects of the present disclosure.

FIG. 4B is a diagram of a top view of an example electroacoustic device 400B including a SAW resonator and an IDC decoupled from a piezoelectric layer included in the electroacoustic device, in accordance with certain aspects of the present disclosure. The electroacoustic device 400B may be similar to the electroacoustic device 400A, but with the addition of a non-piezoelectric region 440 disposed underneath the IDC 420 (e.g., adjacent to the piezoelectric layer 430), as illustrated in FIG. 4B. In certain aspects, no portion of the piezoelectric layer 430 is disposed between the IDC 420 and the non-piezoelectric region 440, such that the IDC 420 is decoupled from the piezoelectric layer 430.

The array of conductive fingers 415 included in the SAW resonator 410 may be aligned in the same direction as the array of conductive fingers 425 included in the IDC 420. As a result, the manufacturing of the array of conductive fingers 415 included in the SAW resonator 410 and the array of conductive fingers 425 included in the IDC 420 may be easier and less costly.

Figure 4C:
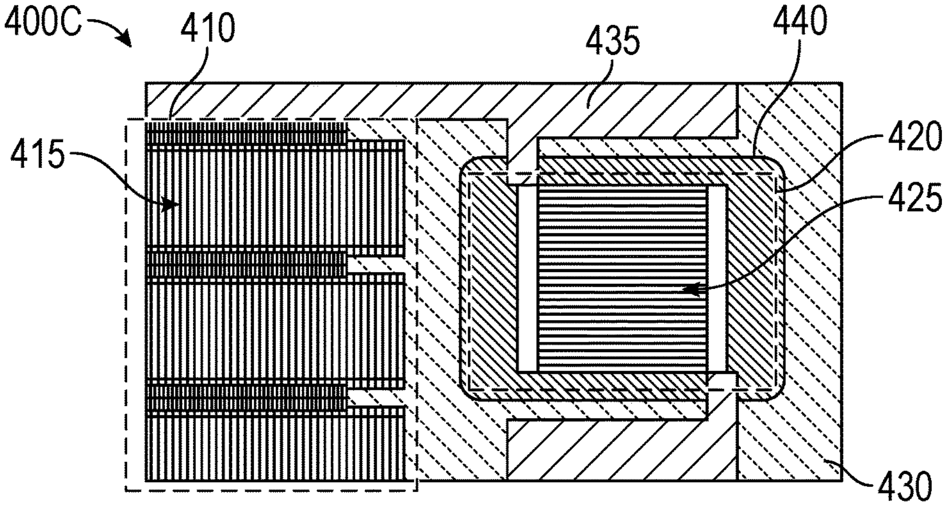
FIG. 4C is a diagram of a top view of another example electroacoustic device including a SAW resonator and an IDC decoupled from a piezoelectric layer of the electroacoustic device, in accordance with certain aspects of the present disclosure.

FIG. 4C is a diagram of a top view of another example electroacoustic device including a SAW resonator and an IDC decoupled from a piezoelectric layer included in the electroacoustic device, in accordance with certain aspects of the present disclosure. The electroacoustic device 400C may be similar to the electroacoustic device 400B, but the array of conductive fingers 415 included in the SAW resonator 410 may be aligned in a different direction from the array of conductive fingers 425 included in the IDC 420. For example, the array of conductive fingers 415 included in the SAW resonator 410 may be aligned in a first direction, whereas the array of conductive fingers 425 included in the IDC 420 may be aligned in a second direction, perpendicular to the first direction, as illustrated in FIG. 4C.

Figure 5A:
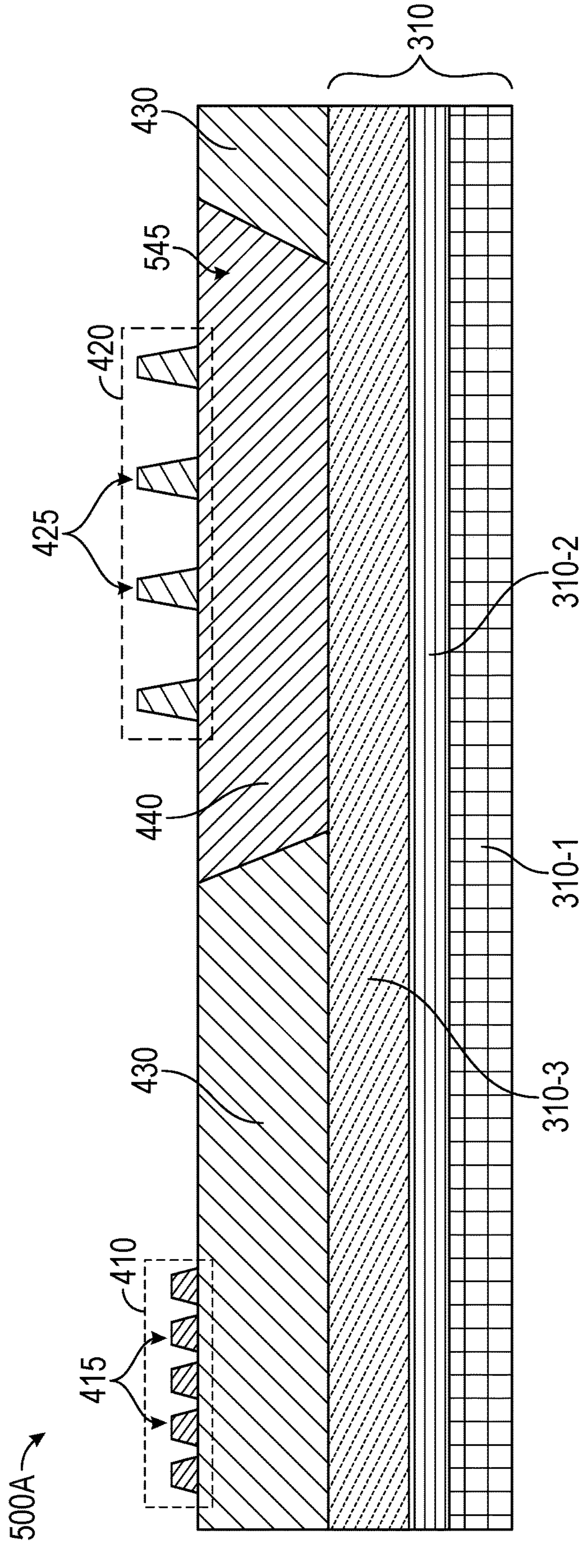
FIG. 5A is a diagram of a cross-sectional view of an electroacoustic device with an IDC that is decoupled from a piezoelectric layer of the electroacoustic device, in accordance with certain aspects of the present disclosure.

FIG. 5A is a diagram of a cross-sectional view of an electroacoustic device 500A with an IDC 420 that is decoupled from a piezoelectric layer 430 of the electroacoustic device, in accordance with certain aspects of the present disclosure. In certain aspects, the electroacoustic device 500A may be implemented as a SAW resonator, which may be a thin film SAW (TF-SAW) resonator.

As illustrated in FIG. 5A, the electroacoustic device 500A may include the SAW resonator 410 disposed above the piezoelectric layer 430 and the IDC 420 disposed above the non-piezoelectric region 440. The SAW resonator 410 may include the array of conductive fingers 415, and the IDC 420 may include the array of conductive fingers 425. The piezoelectric layer 430 may be disposed above the substrate 310, which may include the substrate sublayer 310-1, the trap rich layer 310-2, and the compensation layer 310-3, as described above. The compensation layer 310-3 may be referred to as a temperature compensation layer, and may be disposed below the first non-piezoelectric region 440. The temperature compensation layer may include or be formed of, for example, silicon dioxide ($SiO_2$). In other aspects, the substrate 310 may not be included in the electroacoustic device 500A, and the piezoelectric layer 430 may be implemented as a piezoelectric substrate (e.g., a bulk piezoelectric layer).

As described above, the non-piezoelectric region 440 may be disposed adjacent to the piezoelectric layer 430. In certain aspects, no portion of the piezoelectric layer 430 is disposed between the IDC 420 and the non-piezoelectric region 440, such that the IDC 420 is decoupled from the piezoelectric layer 430. The non-piezoelectric region 440 may be disposed in a cavity 545 of the piezoelectric layer 430. The cavity 545 may be implemented by a depression (e.g., a frustoconical depression), a channel, a groove, a pocket, a trench, or the like. In certain aspects, the cavity 545 may extend from a top surface of the piezoelectric layer 430 to a bottom surface of the piezoelectric layer 430, as illustrated in FIG. 5A. In other aspects, the cavity 545 may not extend from a top surface of the piezoelectric layer 430 all the way to a bottom surface of the piezoelectric layer 430, such that a portion (e.g., a bottom portion) of the piezoelectric layer 430 is disposed beneath the non-piezoelectric region 440 (e.g., the piezoelectric layer 430 is continuous across the electroacoustic device 500A). In yet other aspects, the cavity 545 may extend from a top surface of the piezoelectric layer 430 into a portion of the substrate 310 (e.g., into at least a portion of the compensation layer 310-3). For certain aspects, the depth of the non-piezoelectric region 440 may be at least two wavelengths, where the wavelength may correspond to the center frequency of a bandpass filter response for the electroacoustic device.

As illustrated in FIG. 5A, a top surface of the piezoelectric layer 430 and a top surface of the non-piezoelectric region 440 may be coplanar. In other aspects, a top surface of the non-piezoelectric region 440 may be lower than a top surface of the piezoelectric layer 430, or the top surface of the non-piezoelectric region 440 may be higher than a top surface of the piezoelectric layer 430.

The non-piezoelectric region 440 may include a dielectric material. The dielectric material may include, or be made of, silicon dioxide ($SiO_2$), tantalum pentoxide ($Ta_2O_5$), or any of various other suitable non-piezoelectric dielectric materials.

As illustrated in FIG. 5A, a distance between a top of a conductive finger 415 included in the SAW resonator 410 and the top surface of the piezoelectric layer 430 and a distance between a top of a conductive finger 425 included in the IDC 420 and the top surface of the non-piezoelectric region 440 are different. Stated differently, the heights of the conductive finger 415 included in the SAW resonator 410 and the conductive finger 425 included in the IDC 420 may be different. In other aspects, a distance between a top of a finger included in the SAW resonator 410 and the piezoelectric layer 430 and a distance between a top of a finger included in the IDC 420 and the non-piezoelectric region 440 may be the same. In these aspects, the heights of the conductive finger 415 included in the SAW resonator 410 and the conductive finger 425 included in the IDC 420 are the same.

Figure 5B:
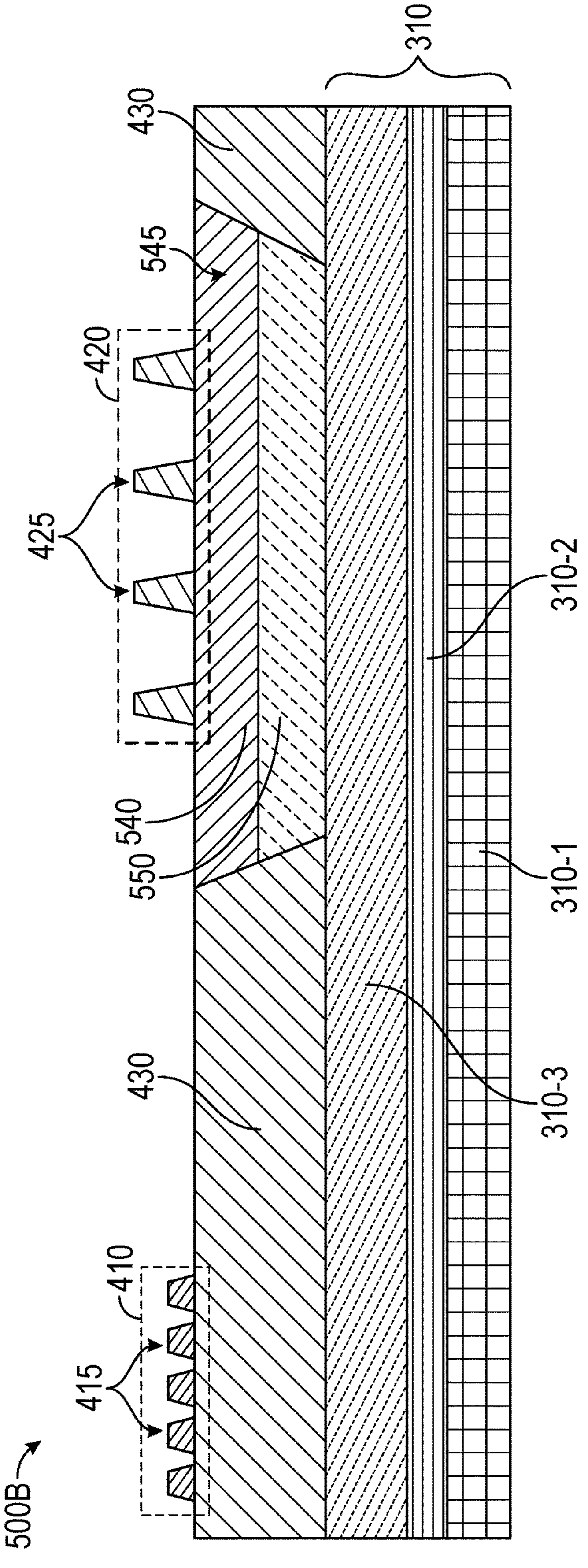
FIG. 5B is a diagram of a cross-sectional view of another electroacoustic device with an IDC that is decoupled from a piezoelectric layer of the electroacoustic device, in accordance with certain aspects of the present disclosure.

FIG. 5B is a diagram of a cross-sectional view of another electroacoustic device 500B with an IDC 420 that is decoupled from a piezoelectric layer 430 of the electroacoustic device, in accordance with certain aspects of the present disclosure. The electroacoustic device 500B may be similar to the electroacoustic device 500A, but the non-piezoelectric region 440 may be implemented with multiple different non-piezoelectric materials. As shown in FIG. 5B, the non-piezoelectric region 440 may be implemented as a first non-piezoelectric region 540 and a second non-piezoelectric region 550. The second non-piezoelectric region 550 may be disposed below the first non-piezoelectric region 540, as illustrated in FIG. 5B, or vice versa. The first non-piezoelectric region 540 may include a first material, and the second non-piezoelectric region 550 may include a second material different than the first material. The first material may have a higher, lower, or the same dielectric constant as the second material. In this manner, the capacitive behavior of the IDC 420 in the electroacoustic device 500B may be modified.

In certain aspects, a filter circuit (e.g., filter circuit 700, which is described below with respect to FIG. 7) may include a plurality of resonators and a capacitor electrically coupled to a resonator in the plurality of resonators, and the capacitor and the resonator may include the IDC 420 and the SAW resonator 410, respectively, of an electroacoustic device (e.g., the electroacoustic device 500A, 500B of FIG. 5A or 5B).

In certain aspects, a wireless device (e.g., electronic device 902, which is described below with respect to FIG. 9) may include an electroacoustic device (e.g., the electroacoustic device 500A, 500B of FIG. 5A or 5B, respectively), and the wireless device may further include at least one of an antenna or a radio frequency (RF) circuit coupled to the electroacoustic device.

Example Operations for Fabricating an Electroacoustic Device

Figure 6:
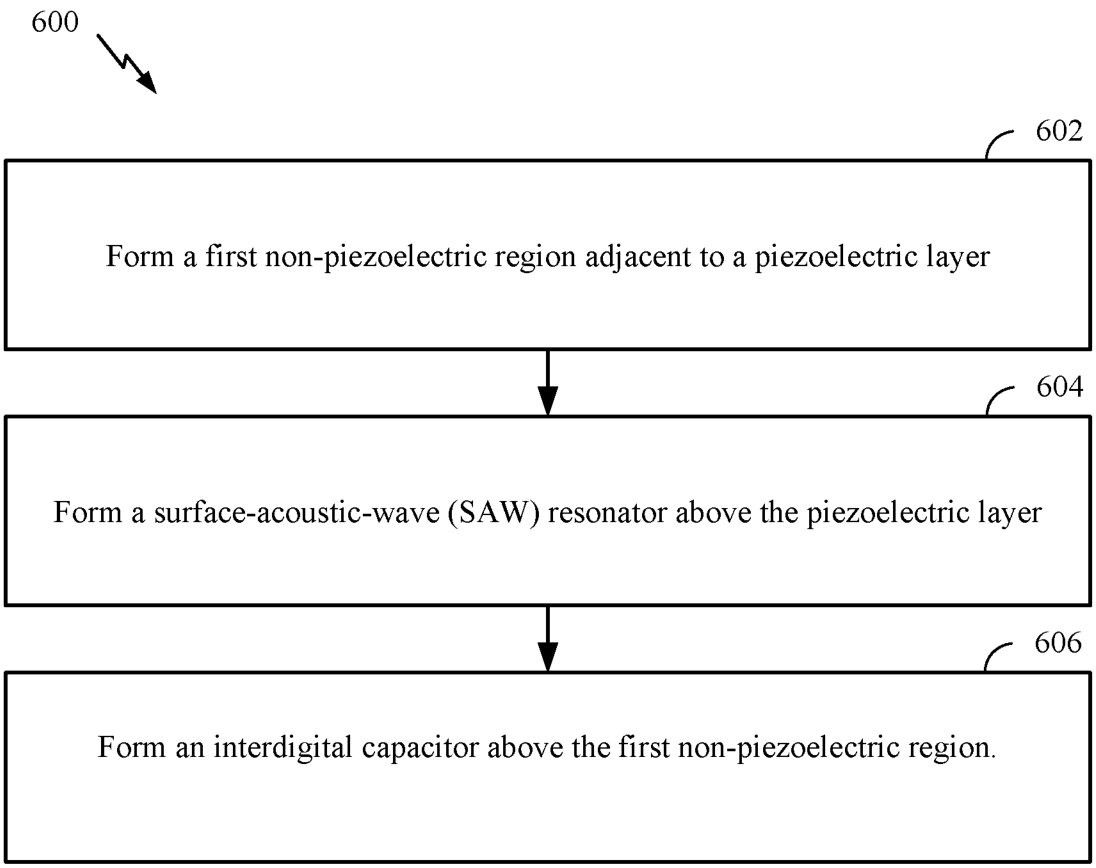
FIG. 6 is a flow diagram depicting example operations for fabricating an electroacoustic device, in accordance with certain aspects of the present disclosure.

FIG. 6 is a flow diagram depicting example operations 600 for fabricating an electroacoustic device (e.g., the electroacoustic device 400A, 400B, 400C, 500A, 500B of FIG. 4A, 4B, 4C, 5A, or 5B, respectively), in accordance with certain aspects of the present disclosure. The operations 600 are described in the form of a set of blocks that specify the operations that can be performed. However, the operations are not necessarily limited to the order shown in FIG. 6 or described herein, for the operations may be implemented in alternative orders or in fully or partially overlapping manners. Also, more, fewer, and/or different operations may be implemented to perform the operations 600. The operations 600 may be performed, for example, by a semiconductor fabrication facility (also referred to as a "fab house") or other facility for electroacoustic device fabrication.

The operations 600 may begin, at block 602, with the fabrication facility forming a first non-piezoelectric region (e.g., first non-piezoelectric region 440, 540) adjacent to a piezoelectric layer (e.g., piezoelectric layer 430). According to certain aspects, forming the first non-piezoelectric region includes forming a cavity (e.g., cavity 545) in the piezoelectric layer and depositing a first non-piezoelectric material in the cavity to form the first non-piezoelectric region. In some cases, the first non-piezoelectric material may completely fill the cavity, whereas in other cases, the first non-piezoelectric material may partially fill the cavity. Forming the cavity may include removing a portion of the piezoelectric layer. Removing the portion of the piezoelectric layer may include etching (e.g., dry etching) the piezoelectric layer to form the cavity. Any other suitable removal process may also be used to form the cavity. In certain aspects, the first non-piezoelectric material may include a dielectric material (e.g., tantalum pentoxide, silicon dioxide, or the like).

At block 604, the fabrication facility may form a SAW resonator (e.g., SAW resonator 410) above the piezoelectric layer.

At block 606, the fabrication facility may form an IDC (e.g., IDC 420) above the first non-piezoelectric region.

According to certain aspects, the operations 600 may further include forming a second non-piezoelectric region (e.g., second non-piezoelectric region 550) adjacent to the piezoelectric layer. In this case, forming the first non-piezoelectric region may involve forming the first non-piezoelectric region above the second non-piezoelectric region. In certain aspects, the first non-piezoelectric region includes a first material, and the second non-piezoelectric region includes a second material, different from the first material. The first material may have a higher dielectric constant than the second material, the same dielectric constant as the second material, or a lower dielectric constant than the second material. For example, the first material may be tantalum pentoxide, whereas the second material may be silicon dioxide.

Each of the layers or regions described above may be formed using any appropriate technique for producing electroacoustic devices. For example, the layers may be formed using e-beam evaporation and lift-off processes.

Example Applications of an Electroacoustic Device

Figure 7:
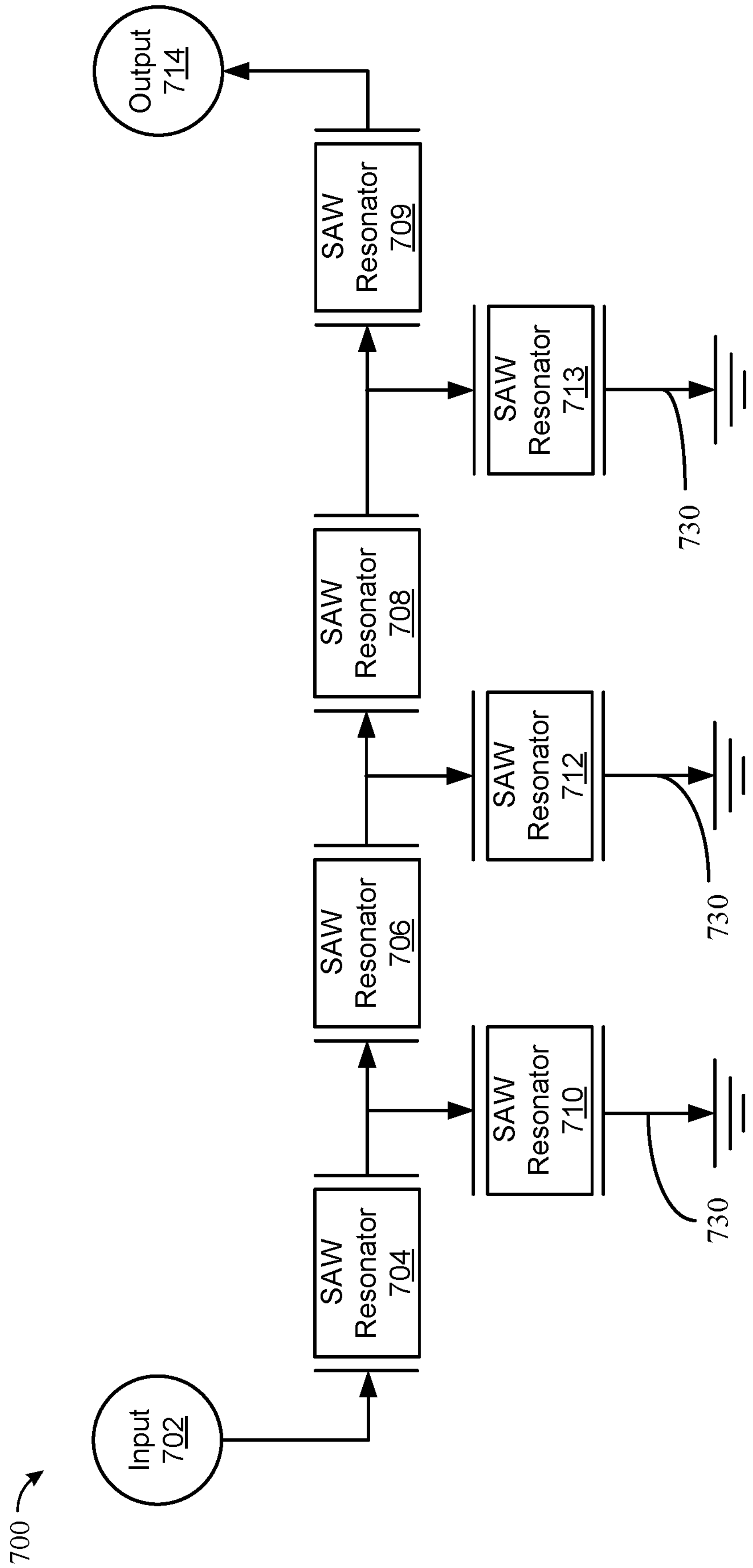
FIG. 7 illustrates a schematic diagram and implementation of an electroacoustic filter circuit, in accordance with certain aspects of the present disclosure.

FIG. 7 illustrates a schematic diagram of an electroacoustic filter circuit 700 that may include an electroacoustic device with a decoupled IDC, such as the electroacoustic device 500A of FIG. 5A or the electroacoustic device 500B of FIG. 5B, in accordance with certain aspects of the present disclosure. The filter circuit 700 provides one example of where the disclosed SAW devices may be used. The filter circuit 700 includes an input terminal 702 and an output terminal 714. Between the input terminal 702 and the output terminal 714, a ladder-type network of SAW resonators is provided. The filter circuit 700 includes a first SAW resonator 704, a second SAW resonator 706, a third SAW resonator 708, and a fourth SAW resonator 709, all electrically connected in a series path between the input terminal 702 and the output terminal 714. A fifth SAW resonator 710 (e.g., a shunt resonator) has a first terminal connected between the first SAW resonator 704 and the second SAW resonator 706 and has a second terminal connected to a reference potential node 730 (e.g., electric ground) for the filter circuit 700. A sixth SAW resonator 712 (e.g., a shunt resonator) has a first terminal connected between the second SAW resonator 706 and the third SAW resonator 708 and has a second terminal connected to the reference potential node 730. A seventh SAW resonator 713 (e.g., a shunt resonator) has a first terminal connected between the third SAW resonator 708 and the fourth SAW resonator 709 and has a second terminal connected to the reference potential node 730.

In certain aspects, the electroacoustic filter circuit 700 may include at least one capacitive element (not illustrated in FIG. 7), which may be implemented by an IDC (e.g., IDC 420 from FIGS. 4A-C and 5A-B) and which may be connected in series or in shunt in the filter circuit 700. Such a capacitive element may replace, may be coupled in series with, or may be coupled in parallel with one of the SAW resonators shown in FIG. 7.

Figure 8:
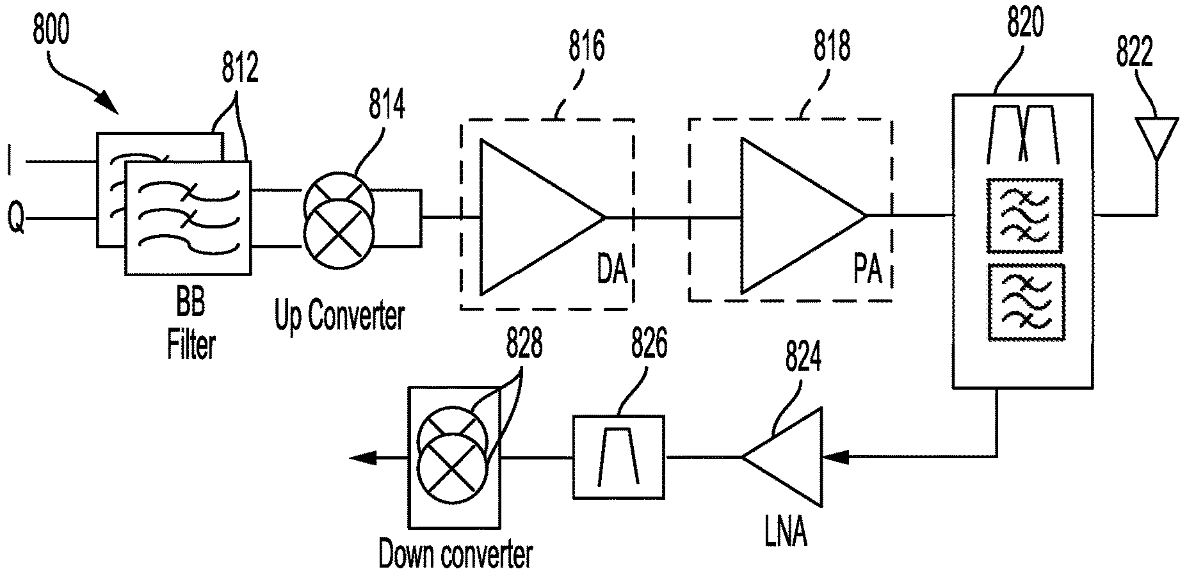
FIG. 8 is a functional block diagram of at least a portion of an example simplified wireless transceiver circuit in which an electroacoustic filter circuit may be employed.

FIG. 8 is a functional block diagram of at least a portion of an example of a simplified wireless transceiver circuit 800 in which the filter circuit 700 of FIG. 7 (or other filters for wireless transmission using electroacoustic devices with decoupled IDCs as described herein) may be employed. The transceiver circuit 800 is configured to receive signals/information for transmission (shown as in-phase (I) and quadrature (Q) values) which is provided to one or more baseband (BB) filters 812. The filtered output is provided to one or more mixers 814 for upconversion to radio frequency (RF) signals. The output from the one or more mixers 814 may be provided to a driver amplifier (DA) 816 whose output may be provided to a power amplifier (PA) 818 to produce an amplified signal for wireless transmission. The amplified signal is output to the antenna 822 through one or more filters 820 (e.g., duplexers if used as a frequency division duplex transceiver or other filters). The one or more filters 820 may include the filter circuit 700 of FIG. 7 (or another filter for wireless transmission using an electroacoustic device with one or more decoupled IDCs, as described herein).

The antenna 822 may be used for both wirelessly transmitting and receiving signals. The transceiver circuit 800 includes a receive path through the one or more filters 820 to be provided to a low noise amplifier (LNA) 824 and a further filter 826 and then downconverted from the receive frequency to a baseband frequency through one or more mixer circuits 828 before the signal is further processed (e.g., provided to an analog-to-digital converter (ADC) and then demodulated or otherwise processed in the digital domain). There may be separate filters for the receive circuit (e.g., the receive circuit may have a separate antenna or have separate receive filters) that may be implemented using the filter circuit 700 of FIG. 7 (or another filter for wireless transmission using an electroacoustic device with one or more decoupled IDCs, as described herein).

Figure 9:
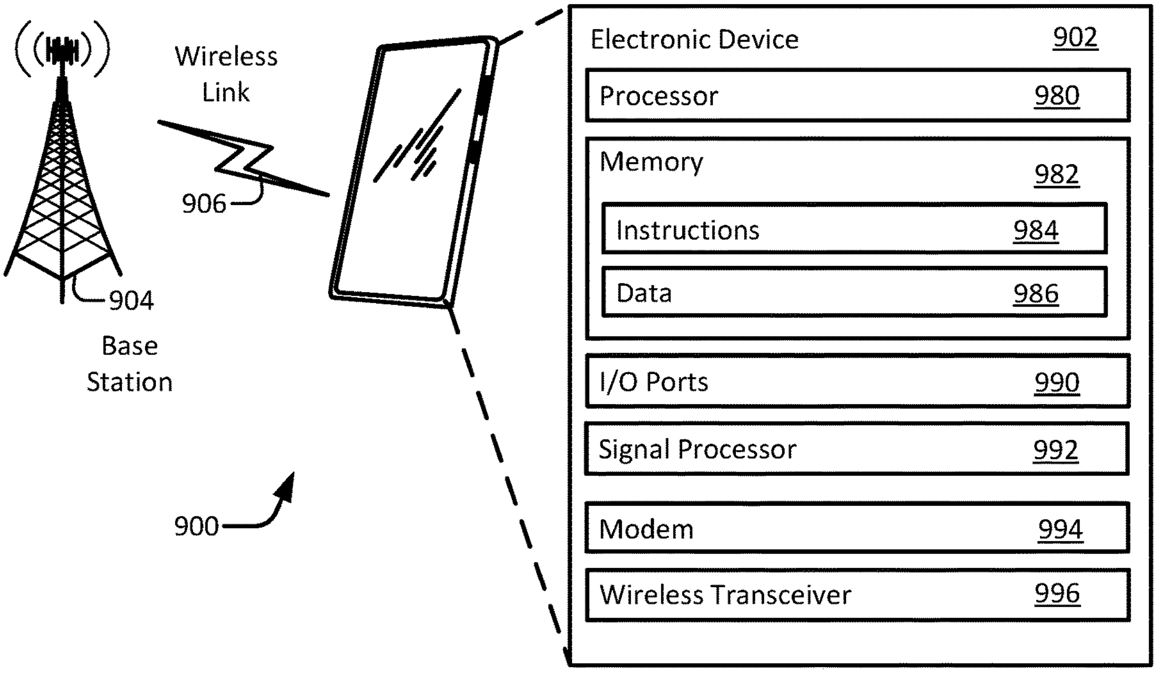
FIG. 9 is a diagram of an environment that includes an electronic device having a wireless transceiver such as the transceiver circuit of FIG. 8.

FIG. 9 is a diagram of an environment 900 that includes an electronic device 902, in which aspects of the present disclosure may be practiced. In the environment 900, the electronic device 902 communicates with a base station 904 (or other network node) through a wireless link 906. As shown, the electronic device 902 is depicted as a smartphone. However, the electronic device 902 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, extended reality device, wearable device, and so forth.

The base station 904 communicates with the electronic device 902 via the wireless link 906, which may be implemented as any suitable type of wireless link. Although depicted as a base station tower of a cellular radio network, the base station 904 may represent or be implemented as another device, such as a satellite, terrestrial broadcast tower, access point, peer-to-peer device, mesh network node, fiber optic line, another electronic device generally as described above, and so forth. Hence, the electronic device 902 may communicate with the base station 904 or another device via a wired connection, a wireless connection, or a combination thereof. The wireless link 906 can include a downlink of data or control information communicated from the base station 904 to the electronic device 902 and an uplink of other data or control information communicated from the electronic device 902 to the base station 904. The wireless link 906 may be implemented using any suitable communication protocol or standard, such as 3rd Generation Partnership Project Long-Term Evolution (3GPP LTE), 3GPP NR 5G, IEEE 802.11, IEEE 802.16, Bluetooth™, and so forth.

The electronic device 902 includes at least one processor 980 and at least one memory 982. The memory 982 may be or form a portion of a computer-readable storage medium. The processor 980 may include any type of processor, such as an application processor or a multi-core processor, that is configured to execute processor-executable instructions (e.g., code) stored by the memory 982. The memory 982 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 982 is implemented to store instructions 984, data 986, and other information of the electronic device 902, and thus when configured as or part of a computer-readable storage medium, the memory 982 does not include transitory propagating signals or carrier waves.

The electronic device 902 may also include input/output ports 990. The I/O ports 990 enable data exchanges or interaction with other devices, networks, or users or between components of the device.

The electronic device 902 may further include at least one signal processor (SP) 992 (e.g., such as a digital signal processor (DSP)). The signal processor 992 may function similar to the processor and may be capable of executing instructions and/or processing information in conjunction with the memory 982.

For communication purposes, the electronic device 902 also includes a modem 994, a wireless transceiver 996, and an antenna (not shown). The wireless transceiver 996 provides connectivity to respective networks and other electronic devices connected therewith using radio-frequency (RF) wireless signals and may include the transceiver circuit 800 of FIG. 8. The wireless transceiver 996 may facilitate communication over any suitable type of wireless network, such as a wireless local area network (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Example Aspects

In addition to the various aspects described above, specific combinations of aspects are within the scope of the disclosure, some of which are detailed below:

Aspect 1: An electroacoustic device comprising: a piezoelectric layer; a surface-acoustic-wave (SAW) resonator disposed above the piezoelectric layer; a first non-piezoelectric region disposed adjacent to the piezoelectric layer; and an interdigital capacitor (IDC) electrically coupled to the SAW resonator and disposed above the first non-piezoelectric region.

Aspect 2: The electroacoustic device of Aspect 1, wherein no portion of the piezoelectric layer is disposed between the IDC and the first non-piezoelectric region, such that the IDC is decoupled from the piezoelectric layer.

Aspect 3: The electroacoustic device of Aspect 1 or 2, wherein the first non-piezoelectric region is disposed in a cavity of the piezoelectric layer.

Aspect 4: The electroacoustic device of Aspect 3, wherein the cavity extends from a top surface of the piezoelectric layer to a bottom surface of the piezoelectric layer.

Aspect 5: The electroacoustic device according to any of Aspects 1-4, wherein a top surface of the piezoelectric layer and a top surface of the first non-piezoelectric region are coplanar.

Aspect 6: The electroacoustic device according to any of Aspects 1-5, wherein a top surface of the first non-piezoelectric region is lower than a top surface of the piezoelectric layer.

Aspect 7: The electroacoustic device according to any of Aspects 1-6, wherein the first non-piezoelectric region comprises a first dielectric material.

Aspect 8: The electroacoustic device of Aspect 7, wherein the first dielectric material comprises silicon dioxide ($SiO_2$).

Aspect 9: The electroacoustic device according to any of Aspects 1-8, further comprising a second non-piezoelectric region disposed below the first non-piezoelectric region.

Aspect 10: The electroacoustic device of Aspect 9, wherein the first non-piezoelectric region comprises a first material, wherein the second non-piezoelectric region comprises a second material, and wherein the first material has a higher dielectric constant than the second material.

Aspect 11: The electroacoustic device according to any of Aspects 1-10, wherein the SAW resonator is a thin film SAW (TF-SAW) resonator, wherein the TF-SAW resonator comprises a temperature compensation layer disposed below the first non-piezoelectric region, and wherein the temperature compensation layer comprises silicon dioxide ($SiO_2$).

Aspect 12: The electroacoustic device according to any of Aspects 1-11, wherein a distance between a top of a finger included in the SAW resonator and the piezoelectric layer and a distance between a top of a finger included in the IDC and the first non-piezoelectric region are different.

Aspect 13: The electroacoustic device according to any of Aspects 1-12, wherein an array of fingers included in the IDC are aligned in a first direction and wherein an array of fingers included in the SAW resonator are aligned in a second direction, perpendicular to the first direction.

Aspect 14: A filter circuit comprising a plurality of resonators and a capacitor electrically coupled to a resonator in the plurality of resonators, wherein the capacitor and the resonator comprise the IDC and the SAW resonator, respectively, of the electroacoustic device according to any of Aspects 1-13.

Aspect 15: A wireless device comprising the electroacoustic device according to any of Aspects 1-14, the wireless device further comprising at least one of an antenna or a radio frequency (RF) circuit coupled to the electroacoustic device.

Aspect 16: A method of fabricating an electroacoustic device, the method comprising: forming a first non-piezoelectric region adjacent to a piezoelectric layer; forming a SAW resonator above the piezoelectric layer; and forming an IDC above the first non-piezoelectric region.

Aspect 17: The method of Aspect 16, wherein forming the first non-piezoelectric region comprises: forming a cavity in the piezoelectric layer; and depositing a first non-piezoelectric material in the cavity to form the first non-piezoelectric region.

Aspect 18: The method of Aspect 17, wherein forming the cavity comprises removing a portion of the piezoelectric layer.

Aspect 19: The method of Aspect 18, wherein removing the portion of the piezoelectric layer comprises etching the piezoelectric layer to form the cavity.

Aspect 20: The method according to any of Aspects 16-19, further comprising forming a second non-piezoelectric region adjacent to the piezoelectric layer, wherein forming the first non-piezoelectric region comprises forming the first non-piezoelectric region above the second non-piezoelectric region.

Aspect 21: The method of Aspect 20, wherein the first non-piezoelectric region comprises a first material, wherein the second non-piezoelectric region comprises a second material, and wherein the first material has a higher dielectric constant than the second material.

Additional Considerations

The various operations of methods described above may be performed by any suitable means capable of performing the corresponding functions. The means may include various hardware and/or software component(s) and/or module (s).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuit.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An electroacoustic device comprising:

a piezoelectric layer;

a surface-acoustic-wave (SAW) resonator disposed above the piezoelectric layer;

a first non-piezoelectric region disposed laterally adjacent to at least a portion of the piezoelectric layer; and an interdigital capacitor (IDC) electrically coupled to the SAW resonator and disposed above the first non-piezoelectric region.

2. The electroacoustic device of claim 1, wherein no portion of the piezoelectric layer is disposed between the IDC and the first non-piezoelectric region, such that the IDC is decoupled from the piezoelectric layer.

3. The electroacoustic device of claim 1, wherein the first non-piezoelectric region is disposed in a cavity of the piezoelectric layer.

4. The electroacoustic device of claim 3, wherein the cavity extends from a top surface of the piezoelectric layer to a bottom surface of the piezoelectric layer.

5. The electroacoustic device of claim 1, wherein a top surface of the piezoelectric layer and a top surface of the first non-piezoelectric region are coplanar.

6. The electroacoustic device of claim 1, wherein a top surface of the first non-piezoelectric region is lower than a top surface of the piezoelectric layer.

7. The electroacoustic device of claim 1, wherein the first non-piezoelectric region comprises a first dielectric material.

8. The electroacoustic device of claim 7, wherein the first dielectric material comprises silicon dioxide ($SiO_2$).

9. The electroacoustic device of claim 1, further comprising a second non-piezoelectric region disposed below the first non-piezoelectric region.

10. The electroacoustic device of claim 9, wherein the first non-piezoelectric region comprises a first material, wherein the second non-piezoelectric region comprises a second material, and wherein the first material has a higher dielectric constant than the second material.

11. The electroacoustic device of claim 1, wherein the SAW resonator is a thin film SAW (TF-SAW) resonator, wherein the TF-SAW resonator comprises a temperature compensation layer disposed below the first non-piezoelectric region, and wherein the temperature compensation layer comprises silicon dioxide ($SiO_2$).

12. The electroacoustic device of claim 1, wherein a distance between a top of a finger included in the SAW resonator and the piezoelectric layer and a distance between a top of a finger included in the IDC and the first non-piezoelectric region are different.

13. The electroacoustic device of claim 1, wherein an array of fingers included in the IDC are aligned in a first direction and wherein an array of fingers included in the SAW resonator are aligned in a second direction, perpendicular to the first direction.

14. A filter circuit comprising a plurality of resonators and a capacitor electrically coupled to a resonator in the plurality of resonators, wherein the capacitor and the resonator comprise the IDC and the SAW resonator, respectively, of the electroacoustic device of claim 1.

15. A wireless device comprising the electroacoustic device of claim 1, the wireless device further comprising at least one of an antenna or a radio frequency (RF) circuit coupled to the electroacoustic device.

16. A method of fabricating an electroacoustic device, the method comprising:

forming a first non-piezoelectric region laterally adjacent to at least a portion of a piezoelectric layer;

forming a surface-acoustic-wave (SAW) resonator above the piezoelectric layer; and forming an interdigital capacitor (IDC) above the first non-piezoelectric region such that the IDC is electrically coupled to the SAW resonator.

17. The method of claim 16, wherein forming the first non-piezoelectric region comprises:

forming a cavity in the piezoelectric layer; and depositing a first non-piezoelectric material in the cavity to form the first non-piezoelectric region.

18. The method of claim 17, wherein forming the cavity comprises removing a portion of the piezoelectric layer.

19. The method of claim 18, wherein removing the portion of the piezoelectric layer comprises etching the piezoelectric layer to form the cavity.

20. The method of claim 16, further comprising forming a second non-piezoelectric region adjacent to the piezoelectric layer, wherein forming the first non-piezoelectric region comprises forming the first non-piezoelectric region above the second non-piezoelectric region, wherein the first non-piezoelectric region comprises a first material, wherein the second non-piezoelectric region comprises a second material, and wherein the first material has a higher dielectric constant than the second material.

* * * * *